United States Patent [19]

Walters

[11] 4,339,712

[45] Jul. 13, 1982

[54] METHOD AND SYSTEM FOR MEASURING WIDTH AND AMPLITUDE OF CURRENT PULSE

[75] Inventor: William O. Walters, Seattle, Wash.

[73] Assignee: The Boeing Company, Seattle, Wash.

[21] Appl. No.: 145,547

[22] Filed: May 1, 1980

[51] Int. Cl.³ .................... G01R 19/16; G04F 8/00
[52] U.S. Cl. .................... 324/102; 324/103 P; 368/118
[58] Field of Search ............ 324/102, 103 P, 103 R, 324/140 R; 368/118

[56] References Cited
U.S. PATENT DOCUMENTS 2,984,787  5/1961  Stolze .................................. 324/102

OTHER PUBLICATIONS

Data File-Time Interval Measurements and How to Make Them; Beckman, Berkley Div., Richmond, Calif.; 1958; pp. 1-9.

Primary Examiner—Ernest F. Karlsen
Attorney, Agent, or Firm—Conrad O. Gardner; B. A. Donahue

[57] ABSTRACT

A shunt is disposed in the current path of a device, e.g. a magnetic particle machine and an input voltage from the shunt is amplified and coupled to: a peak-hold circuit for developing a digital amperage readout; and, a pulse comparator circuit operative with clock, clock gate and counter circuits for developing pulse length readout.

3 Claims, 4 Drawing Figures

METHOD AND SYSTEM FOR MEASURING WIDTH AND AMPLITUDE OF CURRENT PULSE

This invention relates to a circuit for measuring the width and amplitude of current pulses, more particularly a digital system for reading the amperage and pulse length of a pulse of current through a shunt. The aforementioned measurement of current through a shunt enables verification of the accuracy of ammeters and pulse length measurements required to verify the accuracy of currents passing through a shunt such as a shunt in a magnetic particle machine.

Present calibration and certification procedures used for magnetic particle machines are tedious and require two inspectors for accomplishment. An analog voltmeter is connected across the shunt in the aforementioned equipment and the maximum reading must be noted during the short (0.5 to 1.5 second) pulse. Without time to note the reading closely, the values are difficult to obtain accurately. Further, in order to measure pulse length, an oscilloscope is connected across the shunt utilized in the aforementioned magnetic particle machines, and the rise and falls points of the trace are noted. Since only one sweep of the trace occurs, these points must be remembered and a computation based on the sweep rate performed to determine actual pulse length.

Heretofore systems in the patent literature have been concerned with special purpose shunts e.g. U.S. Pat. No. 2,634,307 concerns only a special purpose meter shunt. The aforementioned patent is not concerned with the method of measuring width or amplitude of the pulse. A further patent literature reference, viz. U.S. Pat. No. 4,001,684 is concerned merely with a special purpose noninductive shunt. A further literature reference viz. U.S. Pat. No. 3,646,440 is similarly concerned with a special purpose shunt.

U.S. Pat. No. 2,920,275 describes a system which does not measure the length of pulse in contrast to an embodiment of the present invention. In the system of U.S. Pat. No. 2,920,275 the magnitude of the peak value of the pulse only is measured, the system having two electro-switching which must be operated in sequence or under some external control in order to perform correctly. A preferred embodiment of the present invention in contrast senses the beginning of the pulse based only on the level of the pulse itself, and no external switch is utilized. The aforementioned patented system and the present preferred embodiment utilize a capacitor to hold the output level; however, in the present preferred embodiment, a voltage follower and a diode are utilized to prevent the capacitor from discharging rather than a switch which must open slightly ahead of the end of the pulse. The present system embodiment is not dependent upon the time of switch closure to function.

In the system of U.S. Pat. No. 3,735,261, a peak detector is utilized as is done in the present preferred embodiment; however, the peak and hold in the patent reference circuit is utilized for the detection of pulse rise time. The preferred embodiment system utilizes a peak hold circuit to maintain the amplitude so it may be read conveniently. Further, timing in accordance with the preferred embodiment is done by counting the number of pulses from a precise frequency source during the time when the pulse is above a certain level. Timing in the aforementioned referenced U.S. Pat. No. 3,735,261 is done with a ramp generator based on the charging of a capacitor.

U.S. Pat. No. 3,543,157 shows a system for preventing error accumulation in analog computers not bearing resemblance in function or design with the preferred embodiment of the present invention.

U.S. Pat. No. 3,575,659 shows a gate binary counter (column 7, lines 18 through 22) similar to that in the present embodiment system; however, the referenced patent counter is used for pulse amplitude detection in contrast to the use in the present embodiment for pulse length determination.

The system exemplified in U.S. Pat. No. 3,317,828 does not show means for measuring pulse amplitude or height. A system is shown for measuring pulse length which differs from the circuit of the present embodiment in that the referenced patent system utilizes a voltage controlled oscillator to generate a signal based on the rise rate of the pulse. The referenced circuit is insensitive to variations in rise rate and measures pulse length based only on signal level. The clipper, selector, counter and clocks utilized in the referenced circuit are all the result of the VCO first stage.

In contrast with the preceding patent literature systems, a preferred embodiment of the present invention concerns a digital system for measuring amperage and pulse length of a shot of current as an aid in the calibration and certification of magnetic particle machines. In accordance with the preferred embodiment, a shunt of selectable range is included in the current path of a magnetic particle machine for monitoring the current pulse therein. In the present system embodiment, the input voltage from the shunt is amplified and fed to a peak hold circuit for developing a digital amperage readout, and further to a pulse comparator circuit operative with clock, clock gate and counter circuits for developing pulse length readout.

The present invention, including further advantages and features thereof may be more fully understood by reference to the following detailed description of a specific embodiment thereof, and to the accompanying illustrative drawings in which.

Figure 1:
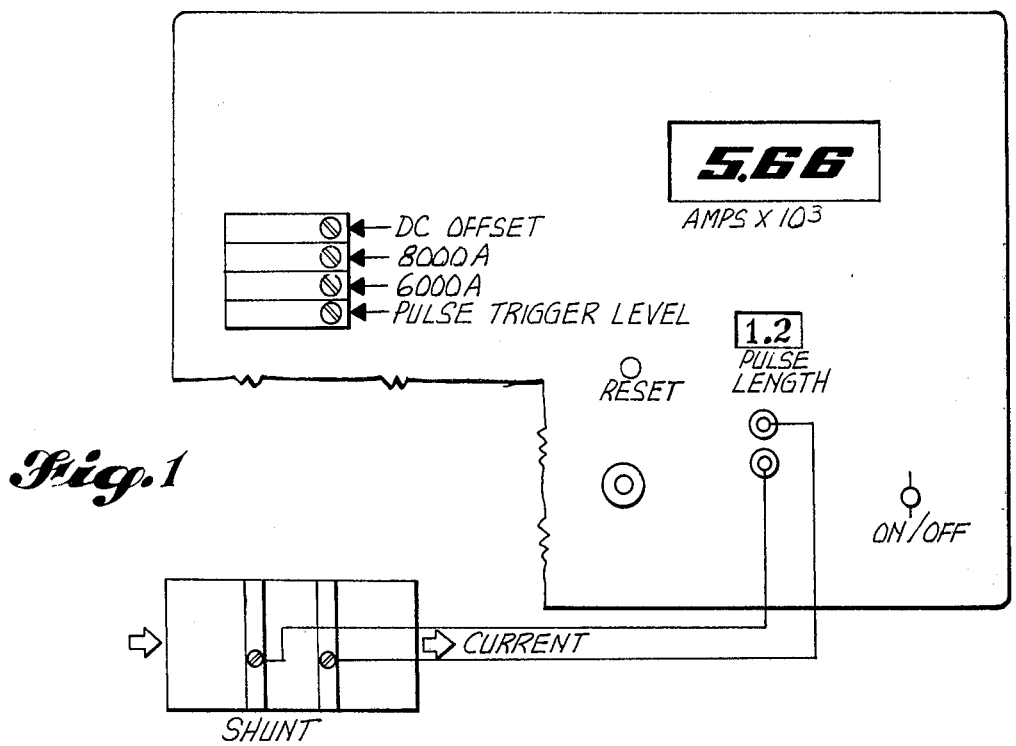
FIG. 1 is a front view of the control and display panel of the present system embodiment.

Turning now to FIG. 1, it will be noted that instrument panel 11 includes two displays. Upper display 80 gives a reading of the current in amperes to three significant figures in thousands of amperes. Lower display 70 reads the pulse length to tenths of a second. Both readings are maintained for convenient reading until reset by reset switch 90 at the left center of instrument panel 11. Lower lefthand control knob 600 on instrument panel 11 is set to correspond to the value of the meter shunt 100 that is in use. On the back of instrument panel 11 are a series of setscrews utilized to control potentiometers behind the setscrews 200, 300, 400, and 500. These setscrews are used to control pulse trigger level, a first optional shunt, a second optional shunt, and a DC offset control respectively. The aforementioned discussed controls incorporated in instrument panel 11 will be discussed in more detail in connection with the complete circuit schematic description of the system shown in FIG. 3.

Figure 2:
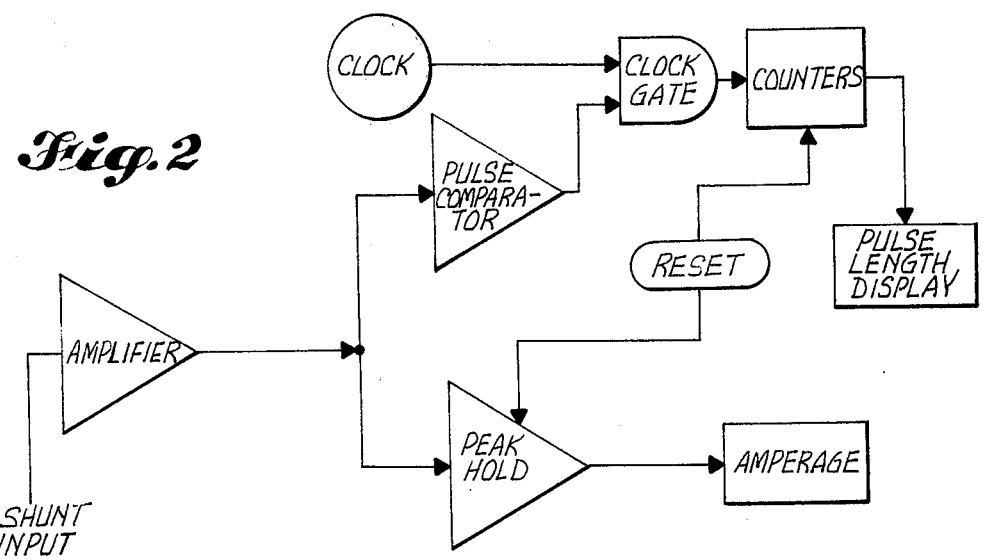
FIG. 2 is a block diagram of the preferred embodiment of the present system.
Figure 3:
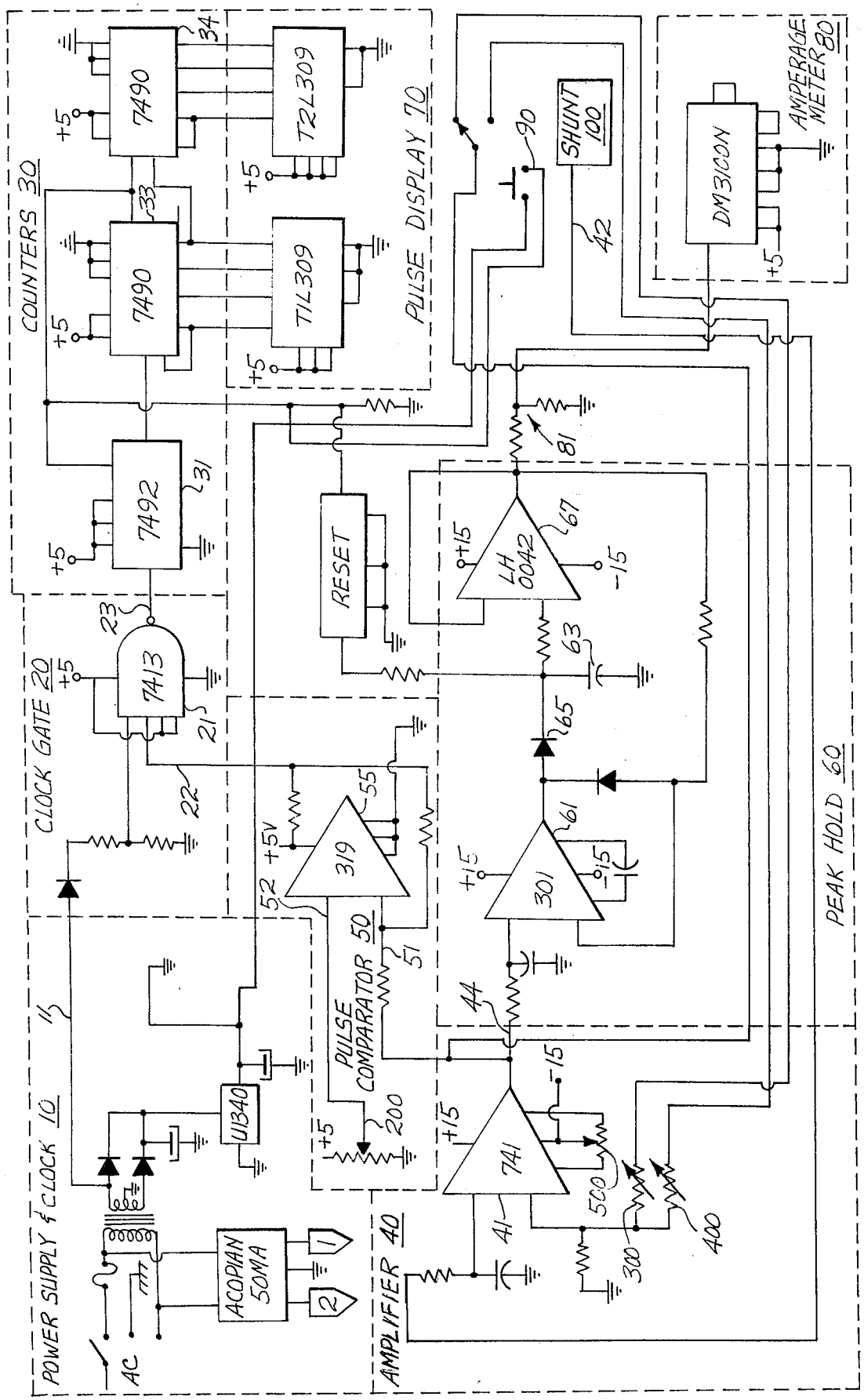
FIG. 3 is a detailed circuit schematic of a preferred embodiment shown in block form in FIG. 2; and, FIG. 4 is a timing diagram deemed helpful in an understanding of the operation of the circuit shown in FIG. 2.

Basic internal operation of the system shown in the detailed schematic of FIG. 3 can be seen in the functional block diagram shown in FIG. 2. As can be seen from the block diagram of FIG. 2 the input voltage from shunt 100 is amplified and coupled to a pulse comparator circuit 50 and a peak hold circuit 60. When the input voltage exceeds a certain predetermined minimum value, pulse comparator circuit 50 allows the clock signal provided by clock 10 (60 Hz, A.C. line) to pass through clock gate 20. The pulses are divided and counted in counters 30, then coupled to pulse length display means 70 which counts up time in tenths of a second until the current stops and clock gate 20 is closed.

The portion of the system of FIG. 2 which provides the amperage reading 80 comprises a selectable gain amplifier and peak hold circuit 60. The gain setting scales the output to read the correct value of current for the particular shunt 100 chosen. Peak hold circuit 60 holds the maximum output of the amplifier at display 80 until reset control 90 is actuated or the display at 80 is replaced by a higher reading.

Turning now to a full electrical schematic of the system shown in FIG. 3, it will be noted that power supply and clocking means 10 provided D.C. voltages (+5 and ±15 volts) utilized in the operation of the semiconductor integrated circuits shown in the system. From the secondary of the power supply transformer of power supply and clock circuit 10, a low voltage 60 Hz A.C. signal is coupled through lead 11 to clock gate circuit 20. This signal provides the time base for pulse length determination and is of the accuracy of the power line frequency. The signal at lead 11 is halfwave rectified and coupled downstream to one input of four input NAND gated Schmidt trigger circuit 20. Two other input terminals of four input NAND gated Schmidt trigger circuit 21 are connected to the +5 volt display. The remaining input 22 provides the gate function. When this input 22 is high (+5 volts), clock pulses equal to the line frequency will appear at the output 23 of four input NAND gated Schmidt trigger circuit 21. When the input signal at 22 is low (+0 volts), the output of four input NAND gated Schmidt trigger circuit 21 appearing at the output 23 will remain low. In this manner, clock gate 20 may be stopped and started at the input 22 by comparator circuit 50. Pulse comparator circuit 50 functions to turn clock gate 20 on when current is flowing through the shunt and off when no current is flowing. Pulse comparator circuit 50 comprises a two input comparator integrated circuit 55, the output 22 of which is high when a first input 51 exceeds the second input 52 and low when input 52 exceeds the level of input 51. The input level of second input 52 is adjustable by means of pulse trigger level control potentiometer 200 (discussed earlier in connection with the controls on instrument panel 11); and input 51 is provided at the output of shunt voltage amplifier circuit 40.

Figure 4:
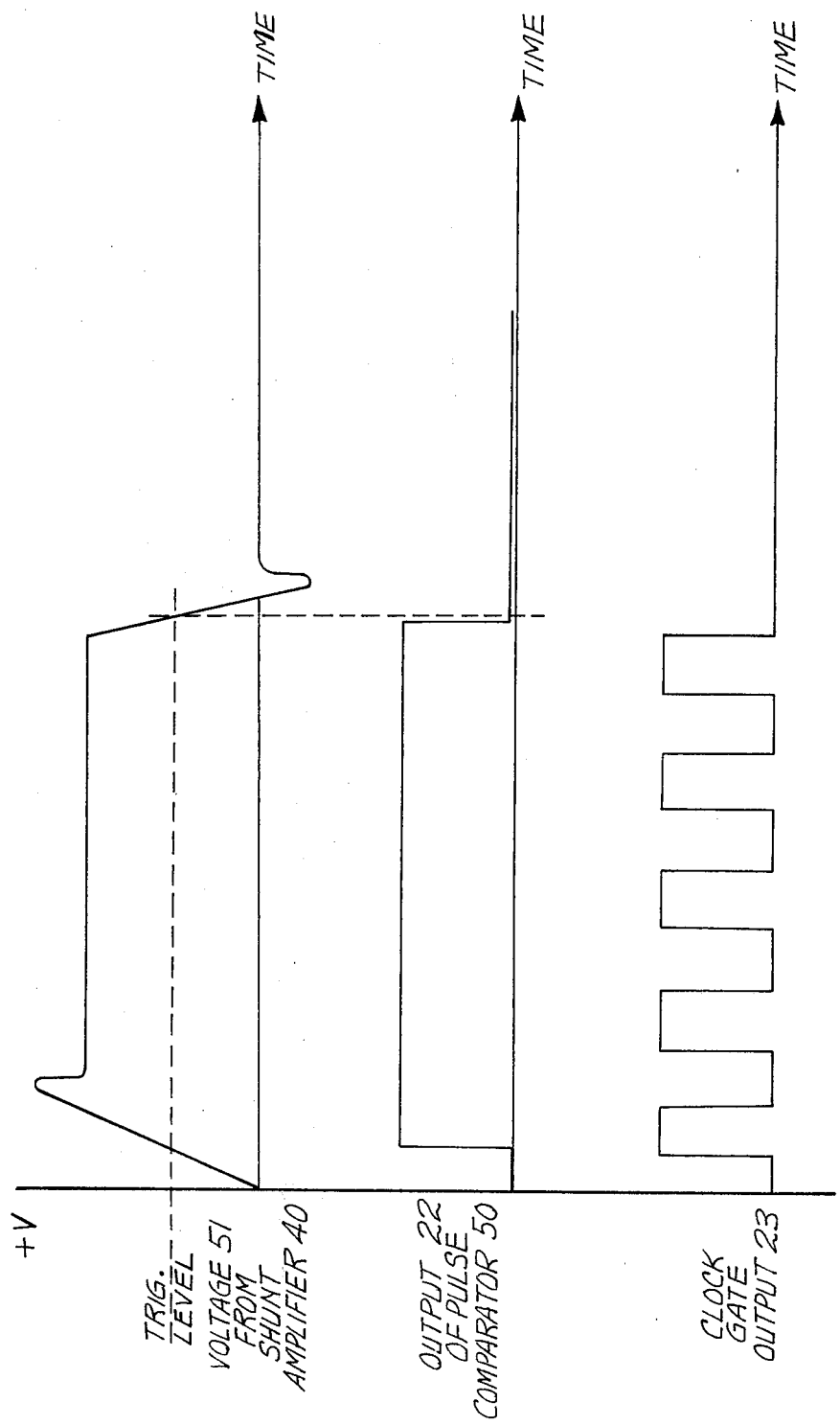

Operation of the aforementioned circuits may be more clearly understood when reference is now made to the wave shape and timing diagram of FIG. 4. The output signal at 23 of clock gate circuit 20 comprises as seen in FIG. 3, 60 Hz positive going only square waves voltages having a 50 percent duty cycle. This output 23 is divided by six in first counter circuit 31 of counter circuit 30 comprising three counters. This divide by six provides ten Hz pulses to decade integrated circuit counters 33 and 34. The counts from decade counters 33 and 34 comprise the inputs to the seven segment displays of pulse display circuit 70 thereby showing the elapsed time in seconds and tenths of seconds.

In the operation of the hereinbefore described system embodiment, a calibrated meter shunt is clamped between the terminals of the utilization device in which the calibrated meter shunt is normally used e.g. between the contact pads of a magnetic particle inspection machine. The pair of shunt connection points are also connected between input terminal 42 of amplifier circuit 40 and ground (note that shunt 100 is shown so connected). When current flows through shunt 100, a small proportional voltage is developed across the shunt. This voltage is amplified by integrated circuit operational amplifier 41 shown in amplifier circuit 40. The gain on amplifier circuit 41 is selectable and adjustable by the potentiometers 300 or 400 depending upon the setting of switch 600 thereby allowing calibration on different sized shunts. The amplified voltage from amplifier circuit 40 is coupled to first input terminal 51 of pulse comparator circuit 50 for subsequent utilization downstream as hereinbefore described to determine pulse length. Also, the amplified voltage from amplifier circuit 40 is coupled by a lead 44 to peak hold circuit 60. Peak hold circuit 60 utilizes operational amplifier 61 to charge capacitor 63 via diode 65. As the voltage rises, following the input, the voltage across capacitor 63 increases, but when the voltage falls, capacitor 63 is prevented from discharging by the action of diode 65. A buffer or voltage follower amplifier circuit 67 is utilized to drive amperage meter circuit 80 without putting undue current drain on capacitor 63 thereby causing its voltage to drop. A reset switch 90 hereinbefore described provides for discharge of capacitor 63 on command of the switch 90 by an operator thereby allowing the present system to be set to zero for repeat evaluation. Reset switch 90 also returns all counters and displays to initial settings so that the counters are cleared and the displays read 00.0 seconds.

The voltage from peak hold circuit 60 is coupled through attenuator circuit 81 and then downstream to the digital panel meter of amperage meter circuit 80 thereby displaying the value of the current.

I claim:

1. A system for measuring and indicating width and amplitude of input signal current pulses comprising in combination:
   a shunt;
   means for amplifying the input signal voltage across said shunt;
   a pulse comparator circuit responsive to said amplified input signal voltage;
   counter circuit means;
   clock gate circuit means coupled between said pulse comparator circuit and said counter circuit means;
   amperage readout circuit means including a display for indicating the amplitude of said input signal current pulses;
   a peak hold circuit coupled between said means for amplifying the input signal voltage across said shunt and said amperage readout circuit means;
   pulse length display circuit means coupled to said counter circuit means, said pulse length display circuit means including a display for indicating the pulse length of said input signal current pulses;
   reset switching means coupled to said counter circuit means for clearing said counter circuit means and resetting said display for indicating the pulse length of said input signal current pulses;
said peak hold circuit including a holding capacitor; and said reset switching means further coupled to said peak hold circuit for discharging said holding capacitor and resetting said display for indicating the amplitude of said input signal current pulses.

2. The invention according to claim 1 wherein said pulse comparator circuit means includes adjustable trigger level control means.

3. The invention according to claim 1 wherein said counter circuit means includes first, second, and third counters, said first counter comprising divide by six counter, and said second and third counters comprise decade counters.

* * * * *